United States Patent [19]
Livolsi et al.

[11] Patent Number: 5,502,400
[45] Date of Patent: Mar. 26, 1996

[54] LOGICALLY CONFIGURABLE IMPEDANCE MATCHING INPUT TERMINATORS FOR VLSI

[75] Inventors: Robert R. Livolsi, Shokan; Robert J. Lynch, Saugerties; George A. Williams, II, Lake Katrine; Roy A. Wood, Saugerties, all of N.Y.

[73] Assignee: International Business Machines Corporation, Armonk, N.Y.

[21] Appl. No.: 196,675

[22] Filed: Feb. 15, 1994

[51] Int. Cl.⁶ .................................................. H03H 11/28
[52] U.S. Cl. ............................................... 326/30; 326/49
[58] Field of Search .................................. 307/443, 451, 307/465; 326/16, 30, 34, 49

[56] References Cited

U.S. PATENT DOCUMENTS

| | | | |
|---|---|---|---|
| 4,085,377 | 4/1978 | Turski et al. | 307/519 |
| 4,719,369 | 1/1988 | Asano et al. | 307/443 |
| 4,783,697 | 11/1988 | Benenati et al. | |
| 4,803,110 | 2/1989 | Ahn et al. | |
| 5,029,284 | 7/1991 | Feldbaumer et al. | 307/443 |
| 5,134,311 | 7/1992 | Biber et al. | 307/443 |
| 5,227,677 | 7/1993 | Furman | 307/443 |
| 5,324,999 | 6/1994 | Hunley et al. | 307/443 |
| 5,341,039 | 8/1994 | Fukumoto | 307/443 |

OTHER PUBLICATIONS

Journal of Electronic Testing: Theory and Applications, vol. 2, 1991—Article entitled "IEEE Standard 1149.1–1990 on Boundary Scan: History, Literature . . . Status", by R. Bennetrs and A. Osseyran, pp. 11–25.

IBM Journal of Search and Development, vol. 34, No. 2/3, Mar./May 1990, article entitled "Boundary–Scan Design Principles For Efficient LSSD ASIC Testing" by R. W. Bassett et al, pp. 339–354.

*Primary Examiner*—Edward P. Westin
*Assistant Examiner*—Benjamin D. Driscoll
*Attorney, Agent, or Firm*—Lynn L. Augspurger

[57] ABSTRACT

Electrical characteristics of the inputs to VLSI semiconductor chips can be modified after the chips are fabricated and mounted into multichip modules (packages), at which time the required characteristics are known accurately. The changes are accomplished by incorporating special circuitry at the chip inputs during their design combined with the use of 'boundary-scan' type circuitry that has recently been put in place for device testing. The circuitry allows the impedance characteristics of the chip's receiver to be modified to match that of the driving source and the wiring interconnections between the chip and source. The test circuitry is used to provide the logical signals to selectively switch the circuits to the proper configuration. This enables optimally designed interconnections between the input and output circuitry on the chips and thereby avoids the necessity for costly re-designs.

7 Claims, 3 Drawing Sheets

LOGICALLY CONFIGURABLE IMPEDANCE MATCHING INPUT TERMINATORS FOR VLSI

FIELD OF THE INVENTION

This invention relates in general to an improved data handling interface between electronic semiconductor devices. The invention provides a method to permit the selective alteration of the characteristics of the input circuitry on the devices, thereby permitting optimal performance of the data handling between the devices and other data handling media and devices. The alterations are made on the input circuitry after the devices have been fabricated thus avoiding the need for costly reprocessing. It is particularly valuable in multichip modules (multiple semiconductor devices packaged on a single substrate) where the data handling between chips is crucial to the performance and the density of the overall function.

GLOSSARY OF TERMS

While dictionary meanings are also implied by certain terms used here, the following glossary of some terms may be useful.

TCM A Thermal Conduction Module is a water or air cooled multichip module used within IBM. As used herein, it represents a hybrid circuit component which contains a matrix of VLSI chips mounted on a single carrier (substrate). The substrate has multiple layers of wiring imbedded within it to allow for personalizable interconnections between tile inputs and outputs of the chips.

OCD OCD as it is used in this document refers to the special electronic circuitry used to transmit signals away from the semiconductor device (chip). It is an acronym for 'Off Chip Driver'.

RECEIVER RECEIVER as it is used in this document refers to the special electronic circuitry used to receive signals onto the chip.

TERMINATOR TERMINATOR as it is used in this document refers to the electronic component (resistor or resistive-like device) used to capture the signal with minimal reflections back to its source.

POR Power on Reset (POR) is the start-up procedure (sequence of events) used during the initial powering-on of an electronic device.

VLSI VLSI (Very Large Scale Integration) refers to the currently achievable chip circuit densities and performance for semiconductor devices.

FET FET (Field Effect Transistor) refers to a general type of semiconductor transistor that is currently used throughout tile electronics industry for high density semiconductor applications.

BACKGROUND OF THE INVENTION

The advent of high density and high performance electronic components has resulted in lengthy process times to build the semiconductor chips and therefore the need for the start of their design early in the design path. Also there is no opportunity to redesign the chips, i.e., 'single pass' designs are essential. High performance and density are also driving the need for multichip modules wherein the chips are closely spaced. These multichip modules have numerous interface configurations dependent upon the placement of the chips on the module substrate. Hence we have a conflict between the early chip designs and the unique interface requirements that are determined later in the design flow. This invention resolves the conflict by the use of special circuitry at the inputs to the chips and that can be later reconfigured to match the module requirements.

It is a problem in computer manufacturing that chips which have been put in a component module, such as a TCM, don't test out as they should. There have been schemes to change wires by burning inputs with a laser or a fuse. Circuitry in the gate array field is programmable. However, there still remains the need we recognize that would permit changes in electrical characteristics of chips on a multichip module during the testing process. We have provided a way to do that. In the process of completing our invention, we noted that some existing test methodology related to boundary scan can be incorporated to assist in making the modifications to the input circuitry described herein. These are referenced below:

Prior art: Publications

1. Bennetts R. G., Osseyran A., 'IEEE Standard 1149.1-1990 on Boundary Scan: History, Literature Survey and Current Status', Journal of Electronic Testing: Theory and Applications (JETTA), 1991.
2. Basset R. W., Turner M. E., Panner J. H., Gillis P. S., Oakland S. F., Stout D. W., 'Boundary-Scan Design Principals for Efficient LSSD ASIC Testing', IBM Journal of Research and Development, pp 339–354, 2–3 Mar.–May 1990.

SUMMARY OF THE INVENTION

This invention deals with the use of special circuitry on VLSI chips to enable electrical personalization of the input characteristics of the chip. It also provides a procedure to accomplish these modifications after the chips have been built and placed into multichip modules thereby yielding input circuit configurations consisely matched to the unique requirements of the chips in the final design environment without the necessity of costly chip reprocessing.

The modifications are made particularly to the input circuitry on the chips and therefore require special circuitry incorporated into the inputs during their design and special procedures must be set up to make the modifications. These and other improvements are set forth in the following detailed description. For a better understanding of the invention with advantages and features, refer to the description and to the drawings.

DETAILED DESCRIPTION OF THE INVENTION

Figure 1:
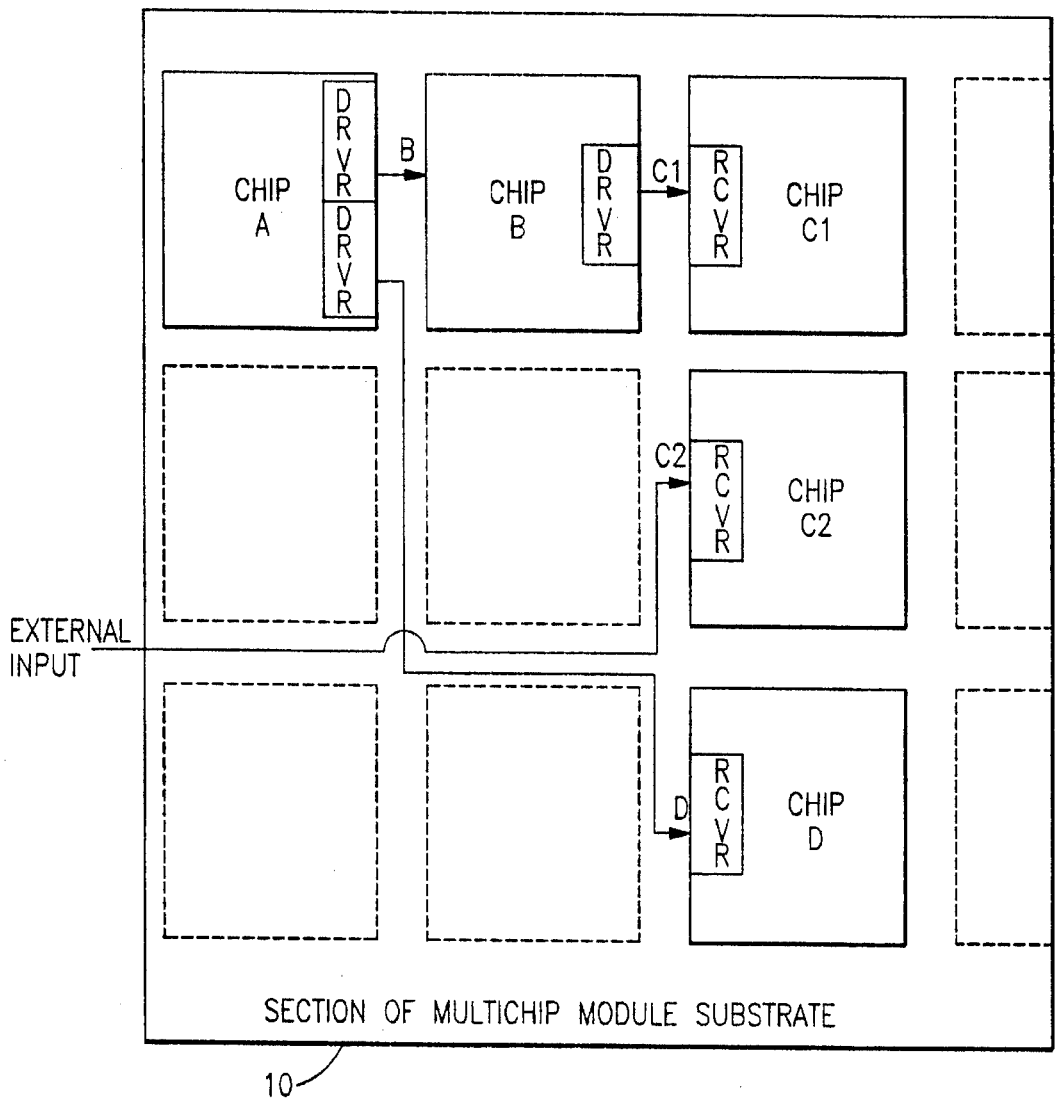
FIG. 1 illustrates a section of a multichip module which can be modified in accordance with the preferred embodiment of our invention.

Turning now to the invention in greater detail, FIG. 1 illustrates a section of a multichip module or hybrid circuit component 10 which can be employed as a TCM with various types of interconnections between chip I/O. The section is illustrated as a complete pad, but as shown by the dotted extensions, additional chips can be added and the substrate expanded. The different interconnections between chip I/O would require different terminating configurations at the inputs to the chips. The termination is a resistor component whose value must match the resistance of the driving source and the wiring interconnections between the chips. The component (10) can support a plurality of chips, represented by CHIP A, CHIP B, CHIP C1, CHIP C2 and CHIP D, each of which have pods provided by driver and receiver circuitry. In the illustration DRVR refers to driver and RCVR refers to receiver circuitry. The chips are interconnected by net circuit connection elements B, C1, C2 and D and one or more of the chips can have an external input C2. Other interconnections (not shown) exist between chips illustrating our invention. Chips C1 and C2 represent chip designs that can be identical except for the required terminations at selected inputs.

1. Interconnection (B) represents a connection between adjacent chips.
2. Interconnection (D) represents a connection between chips spaced relatively far apart on the module substrate.
3. (C1) represents a wire connected to an input and whose source of propagation is from another chip on the module substrate.
4. (C2) represents a wire connected to an input and whose propagation is from an externally supplied source.

Figure 2:
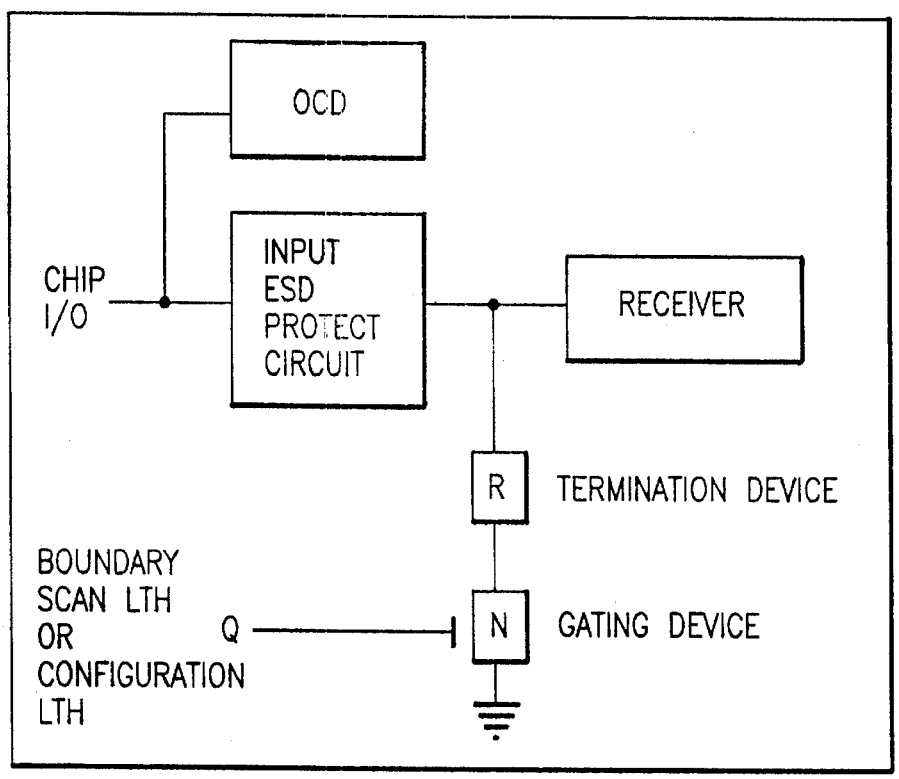
FIG. 2 shows the details of the input circuit configuration to allow its modification between an unterminated and a terminated net connected to chip GROUND.

FIG. 2 shows the details of the input circuit configuration to allow modification of the value of the input termination that is connected to the chip GROUND via TERMINATOR R and Gating Device N. The termination can be modified from a very high resistance (open circuit) to the value of the TERMINATOR by providing a gating signal to Device N. TERMINATOR R is an ohmic resistor fabricated on the semiconductor chip. It can be made by several different methods using passive or active on-chip components. Gating device N is an N-Channel FET that can be switched to a low resistance state to provide a low resistance connection to the chip GROUND. It provides the voltage controlled switch in the path. The termination path is coupled to the chip RCVR and to the chip I/O which is provided with an input ESD protect circuit. The value of R would match the resistance of the interconnecting wiring and source DRVR for those paths that require termination. The open-circuit condition of the termination is used for another type of interconnection (a low power dissipating net) that requires a high resistance at the RCVR input. It is also shown in FIG. 2 that the gating device N is switched electrically by the signal Q from a boundary scan test latch (LTH) or a special configuration latch incorporated in the chip design.

Figure 3:
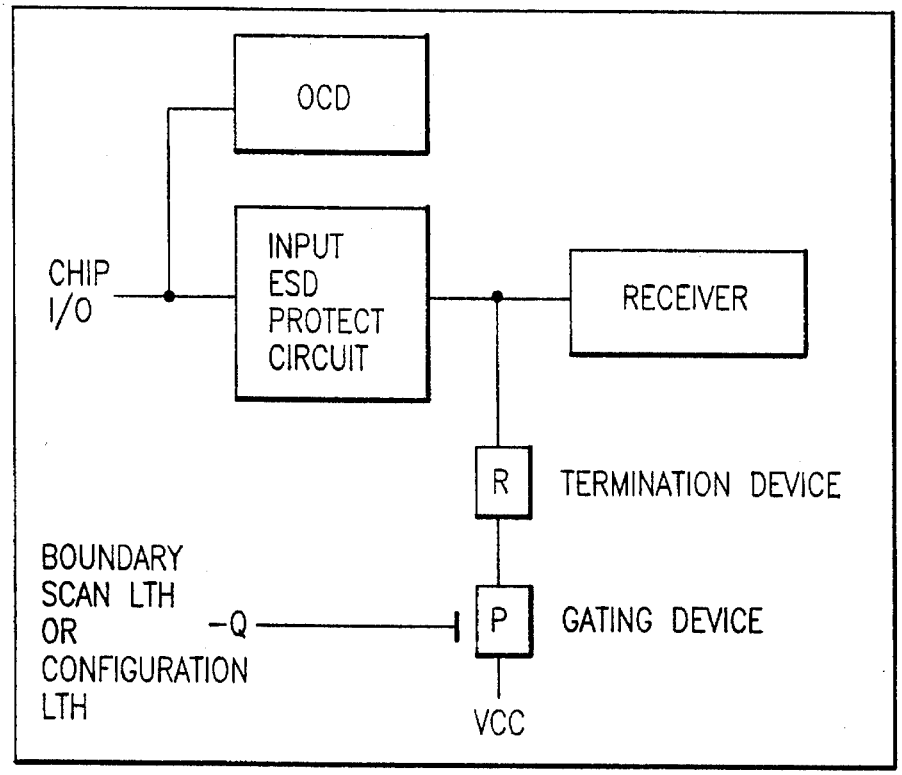
FIG. 3 shows the details of the input circuit configuration to allow its modification between an unterminated and a terminated net connected to chip Voltage Supply (VDD).
Figure 4:
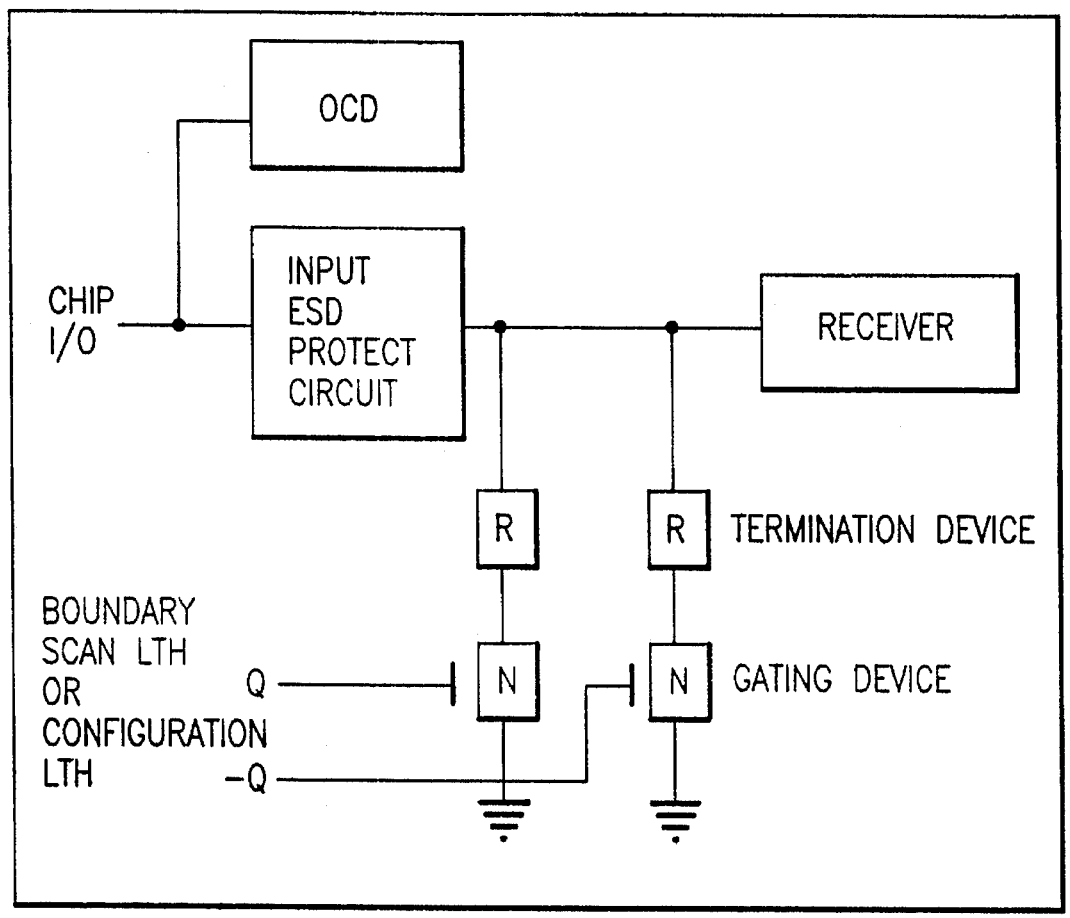
FIG. 4 shows the details of the input circuit configuration to allow modification of the value of the input termination between 2 different values connected to chip GROUND.

FIG. 3 shows the details of the input circuit configuration where the termination has the same I/O coupling as FIG. 2. FIG. 3 provides a gating device P which allows modification of the value of the input termination that is connected to the chip Voltage Supply (VDD). Device P is a P-Channel FET that can be switched to a low resistance connection to VDD. Two common alternate values preferred at VLSI inputs can be selected; one being the value of the interconnecting module wiring and the other an open-circuit. The termination is switched electrically by the signal –Q (Q NOT) from a boundary scan test latch or a special configuration latch incorporated in the chip design FIG. 4 shows the details of the input circuit configuration to allow modification of the value of the input termination that is connected to the chip GROUND. Two TERMINATION devices, R1 and R2 are shown in this example, with two gating devices N1 and N2, ore of which is coupled to receive signal Q and another of which is coupled to receive signal –Q (Q NOT). Alternative values for the TERMINATORs might be; (1) the value to optimally terminate signals that are propagated across thin film wiring (thin film wiring is used predominately for adjacent chip interconnects), or (2) a termination to optimally match the wiring used to interconnect the I/O of chips spaced farther apart from each other. In this example, signals Q and –Q can be switched and the termination is switched electrically by these signals Q and –Q from a boundary scan test latch or a special configuration latch incorporated in the chip design.

It is a feature of our invention to provide for the selection, placement, and the value of chip input terminations within component 10 which includes multichip carriers such as TCM's (Thermal Conduction Modules) and MCM's (Multichip Modules). In accordance with our invention, the selection is done by logical inputs to the chip after it has been built, thus enabling independent optimization of the chip design (I/O placement) and module wiring. Also, in certain applications this allows for the use of a common pad number design for multiple uses. The latter can occur when the same chip function and I/O are required on each of several chips of the same pad number on a component 10 in the form of a TCM or multichip module (MCM) but the nets connected at the inputs require different terminating conditions. The terminating condition is a function of the driving circuit and the number and placement of the loads on the input net.

Terminating resistors (not shown) may be required on selected inputs and common I/O's on TCM's and other MCM's. A limited number of interconnections such as the clock nets which require line matching terminations can be pre-placed and pre-wired on the module. This requires an early floorplanning of the chip and module layouts or rigid wire routing and circuit loading rules for the clocks. However, other signal nets that require terminations might not be identified until the design has progressed to its final stages or their pre-placement to adhere to module wiring rules (net configuration and driver type dependencies) might conflict with optimum chip I/O placements. The use of a block of resistors for the purpose of providing termination is costly in chip I/O and module wiring. Unique terminating conditions that are discovered late in the module design are handled presently by costly chip reprocessing. The cost of module redesign is eliminated when our invention can be employed.

The Preferred Embodiment

FIG. 1 shows an overview of the preferred embodiment of the invention. A section of a VLSI multichip substrate component 10 is shown with the several interconnections B, C1, C2 and D between the chips to illustrate the requirements for different input circuit configurations on different chips. These configurations are dependent upon the the exact characteristics of the source of the signal and of the interconnection path.

There are 2 types of wires which can be used to interconnect the chip I/O which are represented by net connections B, C1, C2 and D. There are wiring grids of thick film wiring within lower levels of the substrate. These are used for low capacitance and low resistance wires and are used to interconnect those chips that are not adjacent. A second method of wiring consists of thin film metallization for interconnecting I/O on adjacent chips (or closely spaced chips). The latter type is more dense but has a different capacitance and resistance per unit length. Each of these 2 types of interconnection requires a different terminating circuit at the input to its respective receiver.

Examples of interconnections using the 2 types of wiring are illustrated in FIG. 1. Interconnection (D) is an example of of a longer interconnect and (B) an interconnect used for I/O between adjacent chips.

Also shown are connections (C1) and (C2) which represent connections to identical chips that require signals from different sources at selected inputs. C1 represents a signal whose wiring path and propagating source is contained solely on the module substrate. C2 is connected to the same input location on an identical chip design. However, it is propagated from off the module and might require a different terminating input circuit configuration to properly receive the signal. With this invention a single part number may be used for these chips and the input terminations can be selected to match their respective requirements.

FIGS. 2, 3, and 4 describe three examples of logically configurable input circuits. FIG. (2) illustrates a logically configurable input circuit with a single value of resistor R connected to GROUND and which can be logically switched into the net at the receiver input. FIG. (3) illustrates a logically configurable input circuit with a resistor R tied to the chip voltage supply (VDD) and which can be electrically selected, and FIG. (4) provides the circuitry required to select 1 of 2 different values of resistance at the receiver inputs. The examples shown in FIGS. (2) and (3) allow the unterminated load condition which is widely used for CMOS interfaces. The need for different values at the inputs as in FIG. (4) would occur in cases where the receivers connect to lines with different characteristic impedances or where a mismatch is tolerated to conserve on power dissipation. In all three examples the inputs to the gating devices are driven by latch output signals Q (or –Q). These latches can be added to the chip for this purpose. Alternatively, the latches can be made available by a known existing 'boundary scan' test methodology which is described here and in more detail in the referenced documents of Bettetts et al and Basset et al.

FIGS. 2 through 4 in accordance with our invention illustrate I/O blocks with personalizable values of terminating resistors R at their inputs. CMOS technology is being used to illustrate the concepts described herein. The blocks contain an OCD, RECEIVER, and termination circuits. All three circuits are available at each I/O site. Present VLSI technologies personalize these I/O to be any combination of the 3 circuits by mask selection and thereby process variations. Chip area is allocated for all three, but the final product contains only the required devices (or in the case of masterslices, only the required devices are connected by metal.)

The gating device in each configuration serves as a switch gated by it's corresponding latch. CMOS technologies such as those used by International Business Machines corporation, EXPRESS (IBM Burlington CMOSIIS process) and HYDRA (CMOSIVS process), have a 'boundary scan' methodology in place at the chip I/O. The boundary scan consists of L1/L2 latches that are serially connected and used to condition the logical STATE of the I/O during module test. These latches enable the use of a 'reduced pin count' tester and can be used at all except some key primary inputs that are required at every cycle of the testing. During POR and functional operation of the machine, the boundary scan path can be used to personalize the input terminations to their correct value. Q and Q NOT (–Q) can be provided directly from the L2 outputs. The same clock that is used for the boundary scan during testing can be used to shift the data into the latches at this time.

Alternative Preferred Embodiments

Multiple values of terminations at a receiver input could be selected by using more than one of the boundary scan latches per input. This is feasible because only a portion of the inputs in a design would need programmability after manufacture. Alternately, as described above, multiple configuration latches could be added to the design to allow multiple values of terminations.

Extensions of these principles can be applied to allow personalization of other characteristics of a design after processing. For example, the source impedance of drivers might be made programmable to tune the matching of a driver (source) impedance to its output load.

While we have described our preferred embodiments of our invention, it will be understood that those skilled in the art, both now and in the future, may make make various improvements and enhancements which fall within the scope of the claims which follow. These claims should be construed to maintain the proper protection for the invention first disclosed.

What is claimed is:

1. A VLSI circuit component, comprising: a carrier substrate component, a plurality of VLSI chips disposed on said carrier substrate component and having a plurality of chip elements made of integrated circuits formed thereon, each VLSI chip having as part of said integrated circuits I/O receiver and driver elements, a net of connections between chip elements of said VLSI chips disposed on the carrier substrate component to provide a configuration at the inputs to the VLSI chips, and a termination unit including two transistors, each of said two transistors receiving a different signal, for altering the line terminating configuration at the inputs to each of said VLSI chips after they have been imbedded into multichip packages, and wherein said termination unit for altering the line termination configuration permits alteration of the VLSI chip inputs without full knowledge of the final I/O interconnections at the time of the chip and substrate designs.

2. The VLSI circuit according to claim 1 wherein each of said two transistors receiving a different signal, for altering the line termination configuration at the inputs to each of the VLSI chips may be selectively activated via a boundary scan test circuit including boundary scan latches to modify input termination configurations on the VLSI chips disposed on the carrier substrate.

3. A VLSI circuit component according to claim 1 wherein the means for altering the line termination configuration permits the design of a single chip part number to satisfy the requirements of similar internal chip functions said single chip part number may be used for separate chips within the VLSI circuit component differing only by their receiver termination requirements.

4. A method of modifying VLSI chips on a carrier component using added pre-designed circuitry, wherein each of said VLSI chips include a a termination unit having two transistors, each of said two transistors receiving a different signal, for altering the line termination configurations of said VLSI chips, comprising the steps of:

a. providing each of said VLSI chips with a signal from a latch;

b. during the steps of chip design, establishing which inputs would require more than the signal provided by said latch;

c. during the steps of chip design, including other latches in addition to said latch, these other latches having their outputs connected to said inputs that require additional signals;

d. setting the logic state of said other latches via a scan path similar to that provided for boundary-scan latches or included in a boundary-scan path with compensation for their presence during testing.

5. A method of modifying VLSI chips on a carrier component to modify the chip input electrical configurations using existing test circuitry, wherein each of said VLSI chips includes a a termination unit having two transistors, each of said two transistors receiving a different signal, for altering the line termination configurations of said VLSI chips, comprising the steps of:

a. establishing receiver termination requirements from final chip placement and completed module wiring; and b. applying termination re-configuration patterns (1's and 0's) to boundary-scan latch clocks and to boundary-scan data inputs to set appropriate latch logic states for each of said plurality of parallel terminating devices connected.

6. A method according to claim 5 wherein:

all required information for clocking and latch to I/O correlation already available from boundary-scan testing.

7. A method according to claim 6, wherein:

input circuits required to provide signals to modify input termination configurations are provided y boundary-scan circuitry already in-place on the VLSI circuit component.

* * * * *